United States Patent
Clements et al.

(10) Patent No.: US 7,307,447 B2
(45) Date of Patent: Dec. 11, 2007

(54) SELF SERIES TERMINATED SERIAL LINK TRANSMITTER HAVING SEGMENTATION FOR AMPLITUDE, PRE-EMPHASIS, AND SLEW RATE CONTROL AND VOLTAGE REGULATION FOR AMPLITUDE ACCURACY AND HIGH VOLTAGE PROTECTION

(75) Inventors: Steven M. Clements, Raleigh, NC (US); William P. Cornwell, Durham, NC (US); Carrie E. Cox, Cary, NC (US); Hayden C. Cranford, Jr., Cary, NC (US); Todd M. Rasmus, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 84 days.

(21) Appl. No.: 11/263,138

(22) Filed: Oct. 27, 2005

(65) Prior Publication Data

US 2007/0103186 A1    May 10, 2007

(51) Int. Cl.
*H03K 17/16*    (2006.01)
*H03B 1/00*    (2006.01)
(52) U.S. Cl. .................. 326/30; 326/27; 327/108; 327/112
(58) Field of Classification Search .......... 326/27, 326/30; 327/108, 112
See application file for complete search history.

(56) References Cited

U.S. PATENT DOCUMENTS

| 5,194,761 | A | | 3/1993 | Smith |
| 5,739,707 | A | * | 4/1998 | Barraclough ............... 327/112 |
| 5,986,489 | A | | 11/1999 | Raza et al. |
| 6,114,885 | A | | 9/2000 | Yang et al. |
| 6,256,235 | B1 | | 7/2001 | Lee |
| 6,268,750 | B1 | | 7/2001 | Esch, Jr. |
| 6,281,715 | B1 | | 8/2001 | DeClue et al. |
| 6,313,682 | B1 | | 11/2001 | Muller, Jr. et al. |
| 6,353,346 | B1 | | 3/2002 | Chan |
| 6,704,818 | B1 | | 3/2004 | Martin et al. |
| 6,707,324 | B1 | * | 3/2004 | Chu ............................ 327/108 |
| 7,078,943 | B2 | * | 7/2006 | Ho et al. .................... 327/108 |
| 2001/0000949 | A1 | | 5/2001 | Rhee |
| 2006/0126401 | A1 | * | 6/2006 | Ba ........................ 365/189.05 |
| 2006/0140309 | A1 | * | 6/2006 | Kuo et al. .................. 375/326 |

OTHER PUBLICATIONS

Load Programmable Off-Chip Driver, IBM Technical Disclosure Bulletin, Jul. 1987, vol. 30 No. 2, pp. 950-951.

* cited by examiner

*Primary Examiner*—Vibol Tan
*Assistant Examiner*—Thienvu Tran
(74) *Attorney, Agent, or Firm*—Josh G. Cockburn; Dillon & Yudell LLP

(57) ABSTRACT

A circuit design method and transmitter that enables flexible control of amplitude, pre-emphasis, and slew rate utilizing a design of a segmented self-series terminated (SSST) transmitter having a parallel configuration of multiple, individually controllable segments of dual pull-up and pull-down transistors. Amplitude control, slew rate control and pre-emphasis control are enabled by manipulation/selection of normal or inverted inputs for the various segments. Also provided is a mechanism for providing/maintaining accurate output across a self-series terminated (SST) transmitter by regulating the supply voltage. Regulation of the supply voltage allows compatibility with conventional serial link receiver termination voltages and protects the transmitter output devices when those voltages are larger than the normal supply for the devices.

19 Claims, 5 Drawing Sheets

SELF SERIES TERMINATED SERIAL LINK TRANSMITTER HAVING SEGMENTATION FOR AMPLITUDE, PRE-EMPHASIS, AND SLEW RATE CONTROL AND VOLTAGE REGULATION FOR AMPLITUDE ACCURACY AND HIGH VOLTAGE PROTECTION

BACKGROUND OF THE INVENTION

1. Technical Field

The present invention relates generally to electronic circuits and in particular to transmitter circuits. Still more particularly, the present invention relates to serial link transmitter circuits and design thereof.

2. Description of the Related Art

The ability to perform and achieve high speed transmissions of digital data has become expected in today's computing environment. In most cases, the transmission of digital data over longer distances is accomplished by sending the data in a high-speed serial format (i.e., one single bit after another) over a communication link designed to handle computer communications. In this fashion, data can be transferred from one computer system to another, even if the computer systems are geographically remote.

In order for high-speed serial transmission to occur, the digital data signal from inside the computer must be transformed from the parallel format into a serial format prior to transmission of the data over the serial communication link. This transformation is generally accomplished by processing the computer's internal data signal through electronic circuitry known as a serial link transmitter or "serializer." The function of the serializer is to receive a parallel data stream as input and, by manipulating the parallel data stream, output a serial form of the data capable of high-speed transmission over a suitable communication link. Once the serialized data has arrived at the desired destination, a piece of computer equipment known as a "deserializer" is employed to convert the incoming data from the serial format to a parallel format for use within the destination computer system.

Conventional high speed serial link transmitters are typically implemented using current-mode circuit techniques and thus require a parallel termination at the source end. When a parallel source end termination is utilized, however, only half of the transmitter output current is passed to the receiver as the transmitter steers the current through only one of the two parallel sides of the transmitter output to the receiver. Thus, to produce a desired output amplitude (e.g., voltage), the current-mode transmitter with parallel termination requires a relatively larger power dissipation to adjust for the loss of approximately 50% of the current.

One development that eliminates this large power dissipation requirement in providing the desired output amplitude is the introduction of a self-series terminated transmitter. With a self-series terminated transmitter, substantially all the transmitter's output current goes to the receiver. Thus, for a given signal amplitude at the receiver, a self-series terminated transmitter dissipates significantly less power than a current-mode transmitter with parallel termination, because all of the self-series terminated transmitter output current goes to the receiver.

Several types of self-series terminated transmitters have been described in prior art. While the self-series termination transmitters provide more efficient power usage, several other limitations have been noted with conventional designs, including ones related to output amplitude control, pre-emphasis control, and slew rate control, among others. Thus, as data transmission speeds continue to increase, there exists an ongoing need for an even better transmitter.

SUMMARY OF THE INVENTION

Disclosed is a segmented self-series terminated (SSST) transmitter that provides greater control of amplitude, pre-emphasis, and slew rate while providing voltage regulation, amplitude accuracy and high voltage protection. The transmitter is designed with multiple segments in parallel, having a combined parallel impedance equivalent to the desired output impedance. In one embodiment, a voltage regulator is provided at the supply input to enable substantially accurate output voltage by regulating the supply voltage. The normal input signal and an inverted input signal are both fed through a series of buffers, with each buffer connected to the input node of one of the segments. A select input signal is provided for each buffer to select either the normal input signal or the inverted input signal. When all segments receive the same input (normal or inverted), a full output signal (normal or inverted) is provided at the output receiver. When one or more of the segments receive an inverted input while the other segments receive a normal input, the output signal is reduce to a fractional part of the full signal based on the ratio of the inverted select signals versus the total of the full complement of select signals.

Further enhancements to the design of the SSST transmitter are also provided to enable slew rate control and pre-emphasis control via the SSST transmitter. In the former transmitter, a resistor is placed between buffer inputs and one buffer is turned off, forcing a single buffer to drive two or more segments and thus controlling the slew rate. In the latter transmitter, a delayed, inverted signal is provided to at least one segment to accentuate the high and low signals generated so as to improve emphasis control on the output signal.

The above as well as additional objectives, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

The present invention provides a circuit design method and transmitter that enables flexible control of amplitude, pre-emphasis, and slew rate utilizing a design of a segmented self-series terminated (SSST) transmitter having a parallel configuration of multiple, individually controllable segments of dual pull-up and pull-down transistors with associated resistors. Amplitude control, slew rate control, and pre-emphasis control are enabled by selection of normal or inverted inputs for the various segments. The invention also provides a mechanism for providing/maintaining accurate output amplitude across a self-series terminated (SST) transmitter (also referred to as a source-series terminated transmitter) by regulating the supply voltage. Regulation of the supply voltage allows compatibility with conventional serial link receiver termination voltages and protects the transmitter output devices when those voltages are larger than the normal supply for the devices.

Each feature of the invention comprises a different configuration of the transmitter-input to enable a particular feature delineated by the heading of the sections below. Notably, four primary configurations are provide, each described in a separate section of the specification: These are : (1) Output Amplitude Regulation/Control which includes both (a) voltage regulation and (b) segmentation; (2) pre-emphasis control; and (3) slew rate control.

In order to differentiate the transmitter designed according to the invention from a standard self-series (or source-series) terminated (SST) transmitter, the transmitter of the invention is referred to as a segmented self-series terminated (SSST) transmitter, indicating that the transmitter is configured in segments according to the embodiments of the invention, as illustrated by the figures and described below. Unless otherwise stated, references to a transmitter described hereinafter are directed to an SSST transmitter.

Referring now to the figures, which illustrates a first SST transmitter with voltage regulation (FIG. 1) and then three embodiments of an SSST transmitter (FIGS. 2-4) configured according to the invention. Within the figures, like numerals are provided for like elements within different figures, while new features are provided separate numbers when first illustrated within the figures.

A. Amplitude Control

1. Voltage Regulation

Figure 1:
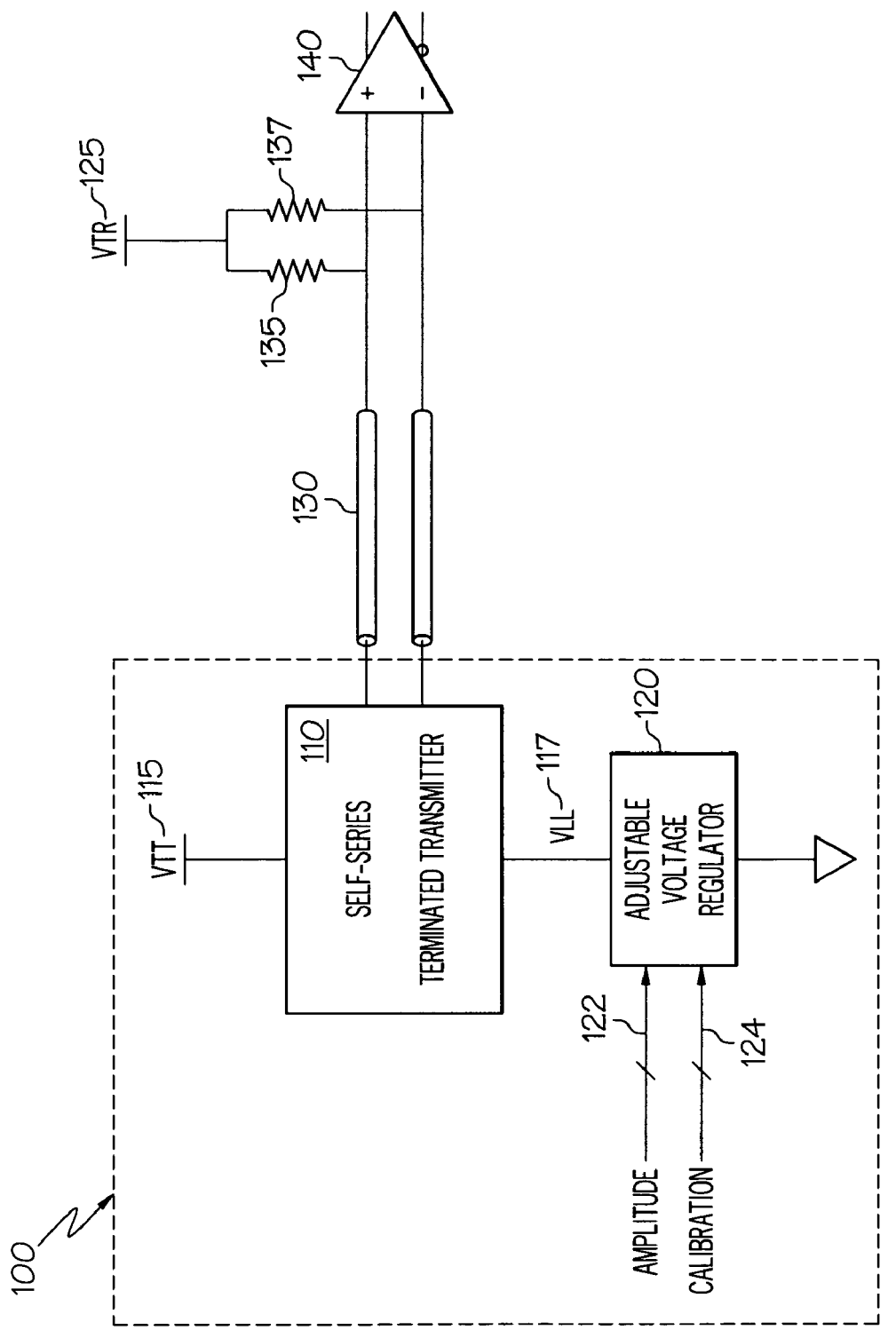
FIG. 1 is a high level diagram of the use of an adjustable voltage regulator to regulate input voltage to a self-series transmitter in accordance with one embodiment of the invention.

As stated above, FIG. 1 provides a low-level block representation of an SST transmitter whose design and operation has been enhanced by addition of an adjustable voltage regulator to enable voltage calibration and amplitude regulation at the inputs, according to a first embodiment (which does not involve the newly designed SSST transmitter).

Conventional SST transmitters are not designed with any mechanism that enables control of the amplitude and accuracy of the output voltage. However, in order to comply with common serial link standards, a transmitter is required to be able to produce accurate (dependable) output amplitudes. Additionally, in order to provide different outputs amplitudes in serial link designs, adjustment may sometimes be required to the supply voltage. Also, signal losses within the transmitter package or connectors can require the output amplitude to be fixed by some form of calibration, such as increasing the power supply by 10%, 20%, or 30%, for example, to negate the signal loss.

With conventional design-and-utilization of self-series terminated transmitters, which connect directly to regular power supplies that occasionally fluctuate in output voltage, regulating and controlling the output amplitude has generally not been possible. The supply voltages are usually too variable to allow sufficient amplitude accuracy, and the supply voltages are generally not easily adjustable.

FIG. 1 thus provides one method that enables a self-series terminated transmitter to meet the desired amplitude requirements both in terms of accuracy and size. As shown, SST transmitter 110 is connected to a high voltage rail 115 at its high voltage node (input) and to adjustable voltage regulator 120 at its low voltage node (input). Adjustable voltage regulator 120 receives two input signals, an amplitude signal 122 and a calibration input signal 124. According to the implemented embodiment, adjustable voltage (e.g., VLL 117) is provided to one or both of the SST transmitter's power supply voltages. Adjustable voltage 117 provides more accurate power than the power supplies (which occasionally fluctuate) thus enabling greater precision and accuracy in the output amplitudes provided by the SST transmitter 110. Further, the transmitter supply voltage may be dynamically set (adjusted) to a desired value without requiring any changes to the external power supply. The adjustable voltage regulator 117 thus further enables the SST transmitter 110 to be easily calibrated to account for any signal losses within the transmitter, its packaging, or connectors.

Self-series terminated transmitter 110 forwards a differential output signal through the channel 130 to the receiver 140. Both differential output signal wires are connected to respective pull-up resistors 135/137 (the receiver termination impedance), which are connected at their high voltage end to each other and to termination voltage rail, VTR 125. Note that receiver 140 and termination 135/137 represent a typical serial link receiver configuration. Other configurations are possible.

By utilizing enhanced transmitter circuit 100 with the above described components, the SST transmitter 110 is able to provide the amplitude accuracy requirements at the receiver end. Further, the adjustable voltage regulator 120 makes it possible to achieve variable and accurate amplitudes. In an alternate embodiment, adjustable voltage regulator 120 may also include an adjustable scaling factor that allows compensation for amplitude losses. This alternate embodiment is implemented because most real systems have variable losses that may affect the output amplitude.

FIG. 1 specifically illustrates a single adjustable voltage regulator 120 coupled to the low voltage input of the SST transmitter 110. The adjustable voltage regulator 120 thus produces the lower supply voltage for the SST transmitter 110. This particular arrangement allows compatibility with the most common serial link receiver structure, which has DC termination impedances to the receiver's upper supply rail. However, while this embodiment is illustrated, other embodiments of the invention (not illustrated) provide several alternate voltage regulator arrangements. For example, in one possible implementation, the adjustable voltage regulator is coupled to the high supply voltage input, while in another possible implementation, two adjustable voltage regulators are provided, one coupled to the low voltage supply and the other coupled to the high voltage supply.

2. Amplitude Control Via Segmentation

While the above enhanced SST configuration provides measurable control in output amplitude and calibration, subjecting the transmitter to variable supply voltages may cause variations in circuit performance, which result in the making the above system design difficult in some implementations, particularly when the voltage regulator 120 is utilized to adjust the output amplitude of the transmitter. In some implementations, in order to achieve the correct output amplitude, a situation may occur where the particular output amplitude requirement may require an input power voltage that is too low to allow correct circuit operation (i.e., the transistors may not receive a large enough current to turn on/operate and or may receive less voltage than is required to operate correctly.

Figure 2A:
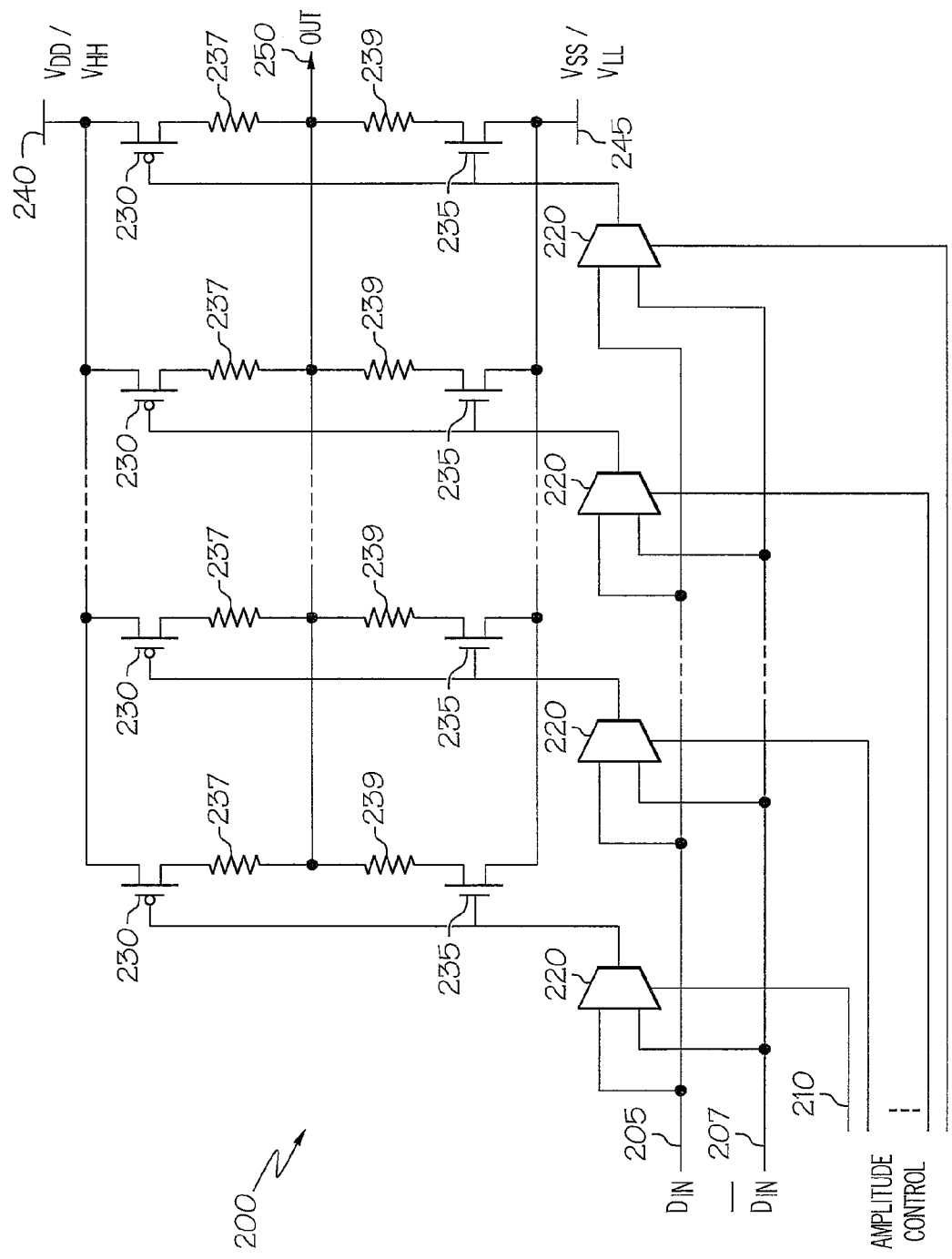
FIG. 2A is a circuit diagram of a segmented self-series terminated Transmitter (SSSTT) according to one embodiment of the invention.

Thus, in addition to the above embodiment that specifically utilizes an SST transmitted enhanced by adding one or more voltage regulators, the other embodiments of the invention provides a segmented SST transmitter (or SSST transmitted as introduced above). FIG. 2A illustrates the configuration of the SSST transmitter. As shown by FIG. 2A and unlike the SST transmitter (which design is known), SSST transmitter is designed with parallel segments (viewed vertically) of paired, connected, transistors and resistors. Each segment consists of pull-up and pull-down elements that are switched by the input data to produce the output waveform. The pull-up elements comprise a P-type transistor 230 connected at its source to the high input rail ($V_{HH}$) 240 and at its drain to pull up resistor 237. Pull-down elements include N-type transistor 235, which is connected to low input rail ($V_{LL}$) 245 at its source and to pull up resistor 239 at its drain. Pull up resistor 237 and pull down resistor 239 are connected (in series) at a common node, which node is connected through each segment and produces the output signal 250. According to this embodiment, SSST transmitter 200 is divided into a number of independently controllable segments. Only four segments are provided within the illustration; However, as suggested by the dashed lines, the number of segments actually utilized is a design parameter tied to the granularity of control desired for the SSST transmitter 200. Thus, for example, the SSST transmitter 200 may comprise 16, 20, 32, 64, or any other number of segments.

The segments each have particular output impedance such that their parallel combination is equal to the desired channel termination impedance. The impedance of each segment may be a combination of the resistor impedances and the transistor impedances; However, it is conceivable that the transistors utilized be sufficiently small to produce a desired impedance without requiring pull up and/or pull down resistive elements. Similarly, the transistors may be sufficiently large that they produce negligible impedances, whereby each segment's impedance value is respectively equal to either the pull up or pull down resistor, since only one transistor (switch) is on at a time.

Figure 2B:
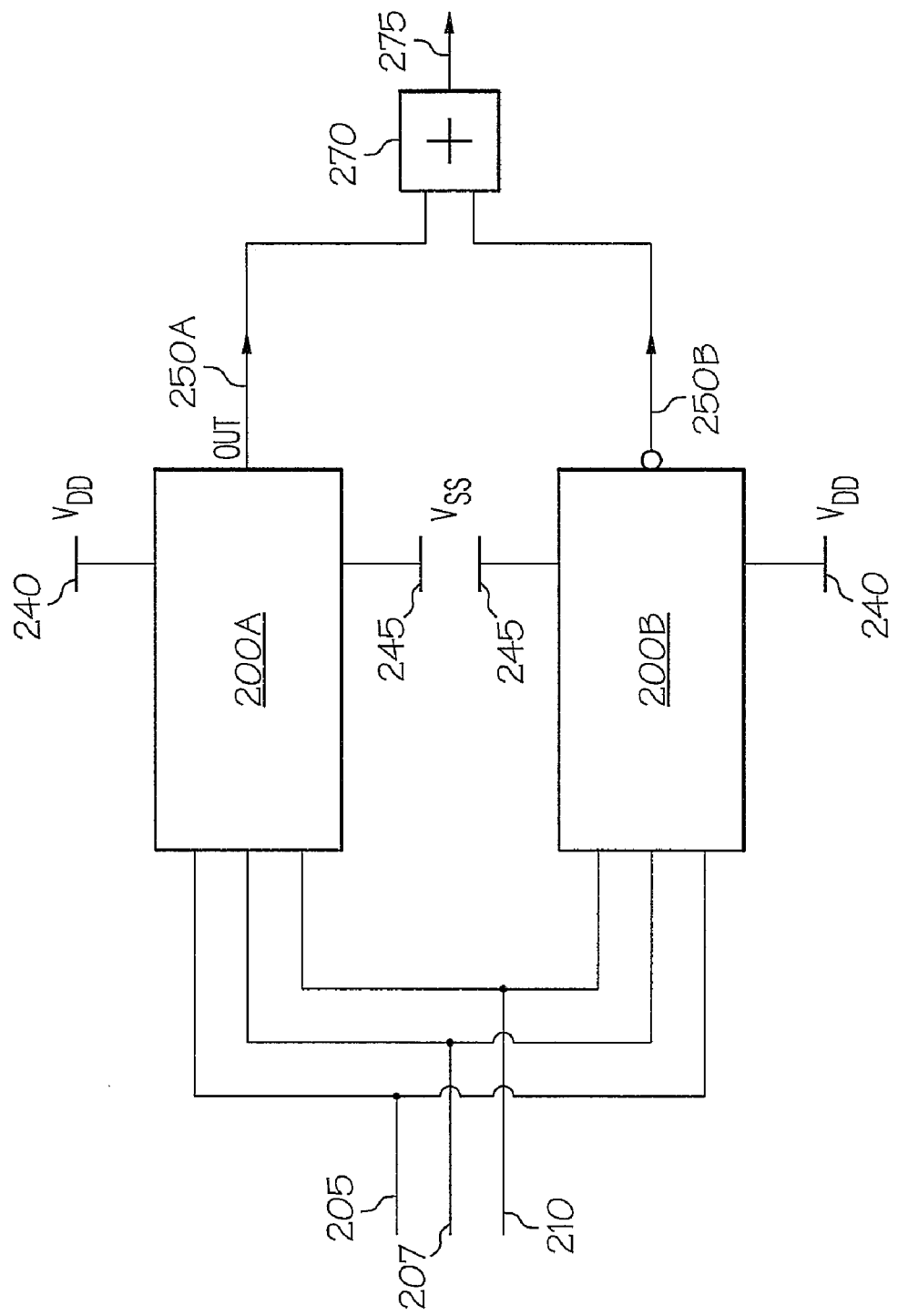
FIG. 2B illustrates a complete differential transmitter comprised of two halves of SSSTT of FIG. 2A according to one embodiment of the invention.
Figure 3:
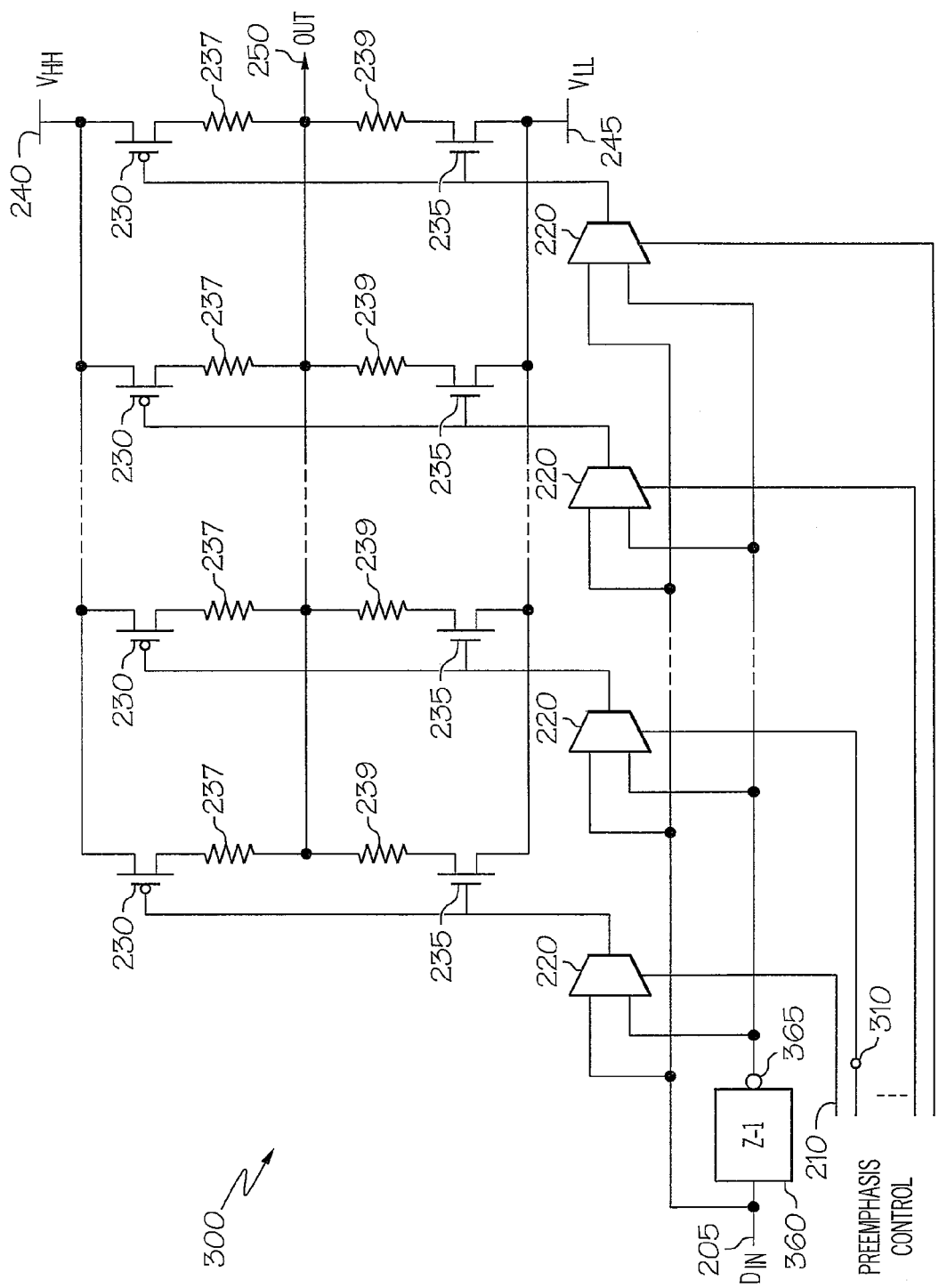
FIG. 3 is a circuit diagram of the SSSTT with a delay and inverter unit for pre-emphasis control in accordance with one embodiment of the invention.
Figure 4:
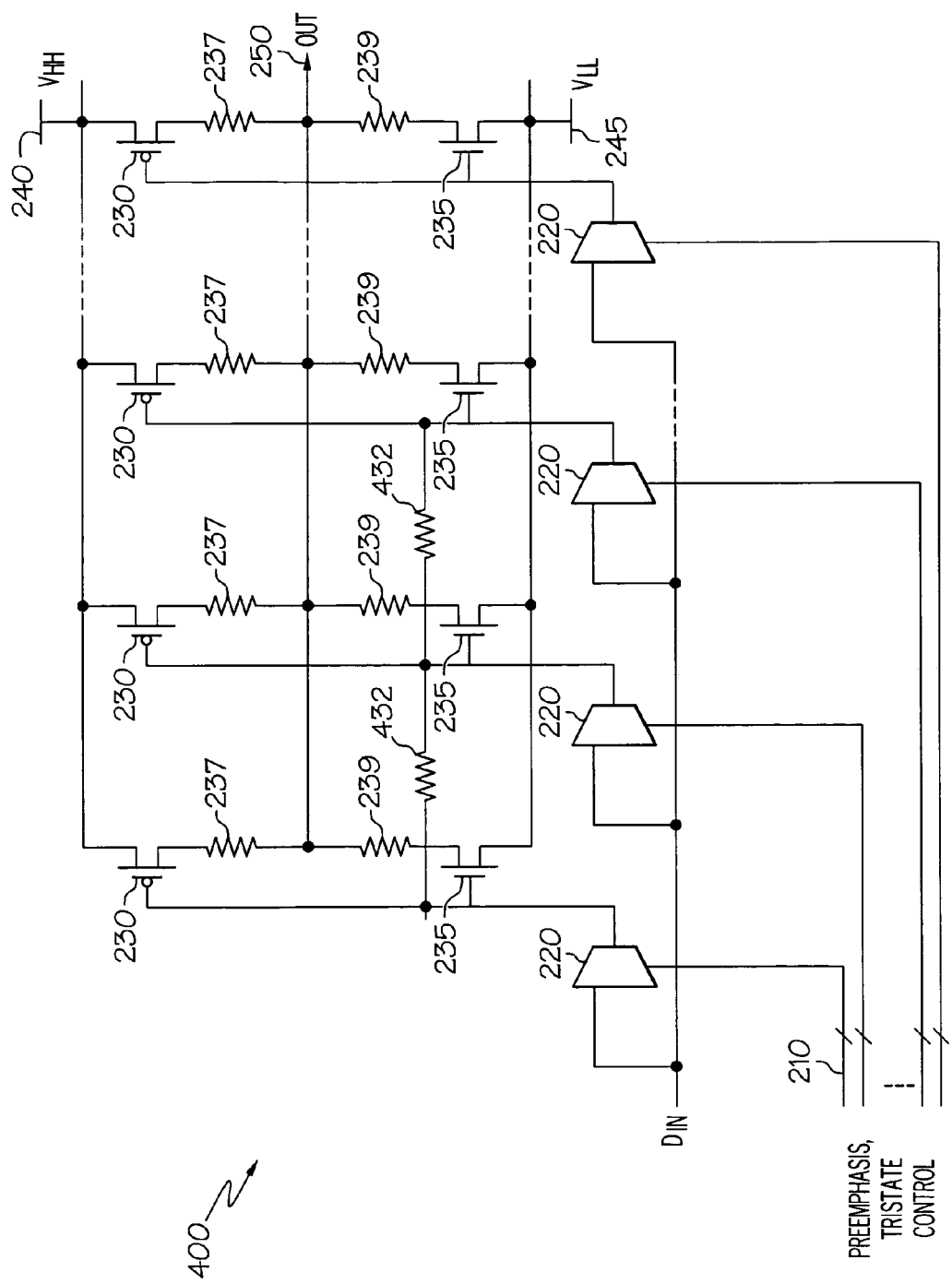
FIG. 4 is a circuit diagram of the SSSTT with additional resistors for slew rate control in accordance with one embodiment of the invention.

In the illustrative embodiment, the transistors utilized are MOS transistors (i.e., P-MOS and N-MOS transistors). While described as MOS transistors, it is understood that the invention maybe practiced with different types of transistors and is thus not limited to those disclosed herein. For example, the transistors may be other types of FETs, bipolar transistors, and the like. Finally, those skilled in the art will appreciate that the provided illustration is of only one half (a top or bottom half) of a complete differential transmitter, as illustrated by FIG. 2B, with both halves 200A, 200B being identical. The actual transmitter output(275) is thus a combination (using adder 270, for example) of the outputs at both halves 200A, 200B. When both halves 200A, 200B operate in tandem they produce outputs 250A, 250B that are of equal magnitude but inverted relative to each other. The combined output 275, following inversion of one of the halves 200B is then two times (2x) the output 250 of the illustrated circuit (FIG. 2A). FIGS. 3 and 4, described below, similarly represent only a single half of the complete differential transmitter.

Implementation of the SSST transmitter design allows for flexible control of transmitter output amplitude without requiring the adjustable voltage regulator (of FIG. 1). Further, this configuration eliminates any issues related to the input power supply not being large enough to enable the transistors to operate normally. The input to each segment is the gate input applied to the PMOS transistor 237 and NMOS transistor 235. As shown, each segment's input is a buffered input received from a respective buffer 220 (or inverting buffer) that actually receives both the data input 205 and a complement of the data input, i.e., inverted data input 207 from the input source (not shown). Individualized amplitude control inputs 210 are fed to the buffers 220 and serve as select inputs to enable the buffer to pass either the normal data input 205 or the inverted data input 207 to the particular segment. For example, if the amplitude control input 210 is a 1, then the inverted data is sent to the segment, while if the amplitude control is a 0, then the normal data input is sent to the segment. In the illustrative embodiment, if amplitude control input 210 is a 0, the buffer 220 passes normal data input 205 to the segment. Alternatively, if amplitude control input 210 is a 1, buffer 220 passes inverted data input 207 to the segment. The data input passed is either a 1 or 0, which respectively turns on either the P-type transistor (230) or the N-type transistor (235). That is, when the data selected to pass through buffer is a 0, the 0 input data causes the upper branch of the segment to be pulled-up by turning on the P-type transistor (while shutting off the N-type transistor). Conversely, when the data selected to pass through buffer is a 1, the 1 input data causes the lower branch of the segment to be pulled-down by turning on the N-type transistor (while shutting off the P-type transistor). While the pull-up and pull-down operations are occurring, the resistance across the segment remains the same.

To achieve the maximum amplitude, all segments are driven with an unmodified (normal) input data signal. To produce smaller amplitudes, a subset (i.e., one or more) of the segments is driven by inverted data. Each inverted segment cancels a portion of the output amplitude provided by itself and another segment receiving normal data input. Notably, the resistor values are selected such that the combination of parallel resistance across the segments adds up to the desired output resistance. Thus, the SSST transmitter enables selectable reduction of output amplitude without reducing or affecting the termination impedance. This method produces amplitudes which are defined fractions of the maximum amplitude while allowing the supply voltage to remain large enough for acceptable circuit performance. With this implementation, the percentage reduction of the output voltage may be calculated utilizing the total number of segments and the number of segments being driven with an inverted input signal. The formula for such calculation utilizing only the single half (as illustrated) of the full transmitter is "actual=max*fraction" or more specifically:

Actual Output Amplitude=Maximum Output Amplitude* [(Number of segments-2*number of inverted segments)/number of segments]

Notably, the calculation involves a subtraction of two times the inverted segments since the inverted segments cancel the voltage gain for an equal number of non-inverted segments. By the same analysis, if more segments receive an inverted data input, the output signal will be a negative value, indicating a reverse in polarity of the output signal. In actual circuit operation, the ideal differential peak-to-peak output amplitude is equal to $V_{HH}-V_{LL}$.

In another embodiment that utilizes the SSST transmitter, amplitude control is provided by statically setting a set (one or more) of the segments to received inverted input from the remaining segments. Thus, rather than driving a certain proportion of the segments with inverted data, the segments are statically set. Then, if pairs of segments are set to opposite, constant data values, similar amplitude reduction and constant impedance is provided as with the dynamic method of setting segments described above (illustrated by amplitude control inputs of FIG. 2A). This embodiment provides a set output voltage relative to the input voltage.

Notably, in one implementation, the segmentation method of amplitude control is combined with the voltage regulator method (described in the related section above) to provide very flexible and accurate transmitter amplitude control. The constant regulator provides amplitude accuracy and a supply level that allows good circuit performance, while the segmentation allows the amplitude to be adjustable while maintaining the desired output impedance.

B. Pre-emphasis Control

One measure of control desired within the transmitter described above and is now provided is that of emphasis (or more specifically pre-emphasis). Pre-emphasis, as utilized herein, refers to the process whereby high frequency components are emphasized relative to low frequency components to improve the overall signal-to-noise (SN) ratio during transmission across the transmission channel. By emphasizing/exaggerating the high frequency components at the transmitter end, pre-emphasis attempts to mitigate (or minimize the adverse effects of) the bandwidth limitations of the channel and the resulting inter-symbol interference (ISI). Conventional serial link transmitters typically provide an adjustable output signal pre-emphasis capability by a structure analogous to a finite-impulse-response (FIR) digital filter, in which delayed versions of the output signal are subtracted from the main signal to create a high-pass characteristic that partially cancels the low-pass characteristic of the channel.

Referring now to FIG. 3, there is illustrated the SSST transmitter 200 of FIG. 2A further adapted/enhanced to provide pre-emphasis control, according to one embodiment. In addition to the segments described above and the input buffers 220, SSST transmitter 200 comprises a different input to enable pre-emphasis control. Rather than the normal and inverted signal inputs of the power amplitude implementation of FIG. 2A SSST transmitter of FIG. 3 includes delay element 360 followed by inverter 365 that delays a copy of the input signal routed along the second input path to the buffers 220 and then inverts the delayed copy of the input. The delay element 360 delays the received input signal by one bit time (i.e., the time for one bit of the input signal to pass through the input). From the perspective of the buffer 220, the inputs received at time T1 are the normal data input 205 and the inverted data input from time T0. That is, assuming the data input at the primary input path (normal data input) to buffer 220 is 10101100, the input seen at the secondary input path is −0101001.

In alternate embodiments, a plurality of delay elements (or a single element providing multiple delays) may be provided to enable multiple delayed versions of the data stream. For example, a delay by 1, 2, 3, or more bit time may be provided. The SSST transmitter is designed to be compatible with this general pre-emphasis approach, simply by supplying the appropriately delayed data to a group of segments.

According to the illustrative embodiment, by representing the transmitter as a number of independently controllable segments, adjustable pre-emphasis control may be implemented within the specific implementation of a self-series terminated transmitter, namely the SSST transmitter 300. As stated above, the segments have output impedances such that their parallel combination is equal to the desired channel termination impedance. Further, each segment consists of pull-up and pull-down elements that are selectively switched by the input data to produce the output waveform.

In the illustrative embodiment, a particular level of pre-emphasis is created by driving a selected subset of the segments with delayed, inverted data (from buffer). Assuming that a single segment is biased to receive the delayed, inverted input data (i.e., select input to buffer always turned on "1"), then for the first data bit after a transition, all the segments pull in the same direction and the transmitter produces a full amplitude output. This enables the transmitter to produce the full amplitude instantaneously during each transition. For a switching run length greater than one bit (i.e., consecutive 0s or 1s), the delayed segments pull in the opposite direction, and the resulting impedance division reduces the output to a defined fraction of the full amplitude. This occurrence thus in effect "de-emphasizes" the lower frequencies. The overall effect of the extended input to the SSST transmitter 300 is to delay, invert, and subtract an input from the overall output being produced through the SSST transmitter 300.

It should be noted that the segmentation schemes for amplitude and pre-emphasis control are completely compatible and may thus be provided within the same SSST transmitter. With this dual function SSST transmitter, some of the segments would be dedicated to pre-emphasis control while all others would be dedicated to amplitude control.

C. Slew-rate Control

Frequently, serial link transmitters are designed with the capability to adjust their output signal slew rate. Slew rate refers to the maximum rate of change of the transmitter's output voltage. That is, the slew rate provides a measure of how fast the output moves, measured in volts per second. An incorrect slew rate may lead to cross talk interference with other channels.

FIG. 4 provides an enhancement to the SSST transmitter 400 that illustrates how segmentation of the self-series terminated transmitter circuit provides a means to control the output slew rate. Each output segment is driven by a separate buffer (also referred to as a pre-buffer) 220 which may be made to take on a high output impedance state. For a selected set of the segments (i.e., one or more sequential segments), the output of each pre-buffer 220 is permanently connected to the output of a previous segment's pre-buffer via a slew-control resistor 432. This connection to the slew-control resistor is in addition to the connection to the gates of the P-type and N-type transistors of the segment. Thus, as shown, one end of a slew-control resistor 432 is coupled to the output of a first pre-buffer 220' and the other end of the slew-control resistor 432 is also coupled to a next (in sequence) pre-buffer output (220"), as shown by the figure.

During operation, each subsequent pre-buffer 220 that has a horizontal resistor 432 connected to its output is turned off (placed in the off state) so that no input data signal is passed through that pre-buffer 220. The determination of which sequence of pre-buffer outputs to cross-connect with slew-control resistors 432 and which pre-buffers 220 are subsequently turn off is a design determination. However, only pre-buffers whose outputs are the same (i.e., normal input data or inverted input data) are series connected in this manner. Two different sets of series connected pre-buffer outputs may be provided within the SSST transmitter 400.

A first pre-buffer 220' in the series of connected pre-buffers operates as the driver of each of the connected segments. With the subsequent pre-buffers in the series shut off, the segments corresponding to these pre-buffers receive input from the first pre-buffer through the slew-control resistor(s) 432. The first pre-buffer 220' services an increased load (slew-control resistors 432 and transistors of subsequent segments) and thus the speed of its output transition is slowed down. Additionally, the slew-control resistors 432 themselves create a delay, which causes the segments to switch at different times (in sequence). Because of the delayed switching—due to the slower movement of the input data through the set of segments, the output is also received at a slower rate compared to the earlier switched segments. The output signal is thus delayed and has to wait until the latter switched segments go to the same state as the earlier switched segments.

With the above described configuration, the SSST transmitter's output slew rate may be reduced by placing a portion of the pre-buffers 220 within the entire group into their high impedance state and allowing the remaining pre-buffers 220 to drive all the output segments in the group. The output segments that are driven through the slew-control resistors 432 experience a small delay in receiving the signal at their input. These delays reduce the output slew rate when the outputs of the segments are summed at the final transmitter output.

Notably, a single control input is utilized within this embodiment, unlike the other illustrations of SSST transmitters, which require dual (differential) inputs, as with FIG. 2A. In one embodiment, control signals received from the buffers 220 may be utilized to determine which pre-buffers should be placed in the off state. With the above described design, when all the buffers are in the on state, there is no effect on the normal operation of the transmitter, since the both ends of slew-control resistor 432 is at the same voltage and thus does not cause a flow of current between connected segments. When turned off, the pre-buffers 220 become high impedance devices, blocking the backward flow of current through them.

Notably, while the pre-buffers of the first two segments in the transmitter are illustrated as supporting slew-control resistors 432, one skilled in the art would appreciate that any segment (other then the first segment) among the multiple available segments may be wired to receive its input signal through the slew control resistors 432 and that the specific depiction and description provided herein are meant solely for illustrating the invention.

While the invention has been particularly shown and described with reference to a preferred embodiment, it will be understood by those skilled in the art that various changes in form and detail may be made therein without departing from the spirit and scope of the invention.

What is claimed is:

1. An electronic circuit comprising:
   a data input node, a select input node, and an output node;
   a plurality of segments arranged in parallel relative to the data input node and the output node, each segment having a pair of transistors and associated resistors;
   a plurality of pre-buffers, each providing an on/off gate signal to the pair of transistors within one of the segments and which each receive a data input and a complement of the data input and a select signal input that enables individualized selection of one of the data input and the complement data input as the on/off gate signal for that segment;
   a resistor coupled between a gate input of a first segment and a gate input of a second segment, wherein gate inputs of multiple adjacent segments may be so connected within the plurality of segments;
   means for enabling said plurality of segments to generate a desired output voltage amplitude utilizing the select signal inputs to turn specific transistors of the pair of transistors in each segment on or off; and
   means for controlling a slew rate of the circuit's output voltage by selectively turning off the gate input signal from the second segment's pre-buffer and providing the gate input from the first segment through the resistor, such that a delay in providing the gate input and subsequently switching the segment on is registered across the overall output of the plurality of segments.

2. The circuit of claim 1, wherein said plurality of segments collectively provides a pre-determined output/channel termination impedance across the output node.

3. The circuit of claim 1, wherein said pair of transistors within each segment includes a pull-up transistor and a pull down transistor connected in series at the output node.

4. The circuit of claim 3, wherein:
   said pull-up transistor is coupled at its drain to a pull-up resistor;
   said pull-down transistor is coupled at its drain to a pull-down resistor; and
   said pull-up resistor and pull down resistor are coupled at their respective other ends to each other via the output node.

5. The circuit of claim 3, wherein the pull-up transistor is a P-type transistor and the pull-down transistor is an N-type transistor.

6. The circuit of claim 3, wherein:
   the pull-up transistors of each segment is coupled at its source to the source of the other pull-up transistors in the other segments and to a source voltage node; and
   the pull-down transistors of each segment is coupled at its source to the source of the other pull-down transistors in the other segments and to a source voltage node.

7. The circuit of claim 3, wherein:
   each segment provides a fractional part of the output voltage magnitude;
   each pull-up segment switched on provides a positive voltage addition to the output voltage magnitude segment;
   each pull-down segment switched on provides a negative voltage addition to the output voltage magnitude;
   maximum output voltage is provided when all the segments are switched in the same direction; and
   maximum output voltage is reduced by twice the fractional part when one of the segments is switched in an opposite direction to the majority of the segments.

8. The circuit of claim 7, wherein:
   a pull-up segment is switched on when the pre-buffer provides a zero (0) gate signal at the gate of the transistor; and
   a pull-down segment is switched on when the pre-buffer provides a one (1) gate signal at the gate of the transistor.

9. The circuit of claim 1, further comprising an adjustable voltage regulator applied to at least one of the voltage inputs of the circuit to enable calibration and accuracy of the measured voltage characteristics of the circuit.

10. The circuit of claim 1, further comprising a delayed inverter coupled between the data input node and the pre-buffers, wherein the pre-buffer receives the data input and a delayed complement of the data input.

11. The circuit of claim 10, wherein:
the delay component of the delayed inverter delays the data input by one or more bit times, said circuit further comprising:
means for providing pre-emphasis control by selecting the delayed inverted input for at least one of the segments of the plurality of segments, wherein the selecting is completed from among (a) biasing the segment's pre-buffer to always select the delayed inverted input and (b) deterministically selecting the delayed inverted input when required.

12. The circuit of claim 1, wherein:
each select signal input is an on/off input that turns the respective pre-buffer on or off; and
each pre-buffer passes only the data input when turned on and no input when turned off.

13. A differential transmitter configured as the electronic circuit of claim 1 having two branches of said plurality of segments operating in tandem to provide a total output characteristic that is a sum of the absolute values of the individual output characteristics of each segment.

14. A method for producing a self-series terminated transmitter comprising:
assigning a data input node, a select input node, and an output node;
providing two branches of a plurality of parallel-connected segments of transistors relative to the data input node and the output node, each segment having a pair of transistors and associated resistors, wherein (a) said pair of transistors includes a pull-up transistor and a pull down transistor connected in series at the output node; and (b) said pull-up transistor is coupled at its drain to a pull-up resistor;
(c) said pull-down transistor is coupled at its drain to a pull-down resistor; (d) said pull-up resistor and pull down resistor are coupled at their respective other ends to the each other via the output node; (e) the pull-up transistors of each segment is coupled at its source to the source of the other pull-up transistors in the other segments and to a source voltage node; and (f) the pull-down transistors of each segment is coupled at its source to the source of the other pull-down transistors in the other segments and to a source voltage node;
providing a pre-buffer for each segment and connecting an on/off gate signal from the pre-buffer output to the gates of the pair of transistors within the segment;
coupling a first input of the pre-buffer to a data input and a second input to a complement of the data input;
providing a select signal input to the pre-buffer that enables individualized selection of one of the data input and the complement data input as the on/off gate signal for that segment;
coupling a resistor between a gate input of a first segment and a gate input of a second segment, wherein gate inputs of multiple adjacent segments may be so connected within the plurality of segments, and whereby slew rate control of transmitter's output voltage is provided during operation by selectively turning off the gate input signal from the second segment's pre-buffer and providing the gate input from the first segment though the resistor, such that a delay in providing the gate input and subsequently switching the segment on is registered across the overall output of the plurality of segments; wherein said select signal turns the pre-buffer on or off and only the data input is passed when the pre-buffer is turned on and no input is passed when the pre-buffer is turned off;
wherein, the configuration of the transmitter enables the plurality of segments to generate a desired output voltage amplitude utilizing the select signal inputs to turn specific transistors of the pair of transistors in each segment on or off; and
wherein the two branches of said plurality of segments operating in tandem to provide a total output characteristic that is a sum of the absolute values of the individual output characteristics of each segment.

15. The method of claim 14, further comprising calibrating the termination impedance at the output node by one or more of (a) adding or subtracting segments and (b) changing values of the resistors within segments, such that said plurality of segments collectively provides a pre-determined output/channel termination impedance across the output node.

16. The method of claim 14, wherein:
each segment provides a fractional part of the output voltage magnitude;
each pull-up segment switched on provides a positive voltage addition to the output voltage magnitude segment;
each pull-down segment switched on provides a negative voltage addition to the output voltage magnitude;
maximum output voltage is provided when all the segments are switched in the same direction; and
maximum output voltage is reduced by approximately twice the fractional part when one of the segments is switched in an opposite direction to the majority of the segments.

17. The method of claim 14, wherein:
the pull-up transistors are P-type transistors and the pull-down transistors are N-type transistors;
a pull-up segment is switched on when the pre-buffer provides a zero (0) gate signal at the gate of the transistor; and
a pull-down segment is switched on when the pre-buffer provides a one (1) gate signal at the gate of the transistor.

18. The method of claim 14, further comprising connecting an on-chip, adjustable voltage regulator to at least one of the voltage inputs of the circuit to enable calibration and accuracy of the measured voltage characteristics of the circuit.

19. The method of claim 14, further comprising providing a delayed inverter coupled between the data input node and the pre-buffers, wherein the pre-buffer receives the data input and a delayed complement of the data input, and wherein the delay component of the delayed inverter delays the data input by one or more bit times to enable pre-emphasis control during operation of the transmitter by selecting the delayed inverted input for at least one of the segments of the plurality of segments, wherein the selecting is completed from among (a) biasing the segment's pre-buffer to always select the delayed inverted input and (b) deterministically selecting the delayed inverted input when required.

* * * * *